United States Patent
Kanarov et al.

(10) Patent No.: US 7,414,355 B2
(45) Date of Patent: Aug. 19, 2008

(54) CHARGED PARTICLE BEAM EXTRACTION AND FORMATION APPARATUS

(75) Inventors: Viktor Kanarov, Bellmore, NY (US); Alan V. Hayes, Centerport, NY (US); Rustam Yevtukhov, Briarwood, NY (US); Daniel Yakovlevitch, Mineola, NY (US)

(73) Assignee: Veeco Instruments, Inc., Plainview, NY (US)

( * ) Notice: Subject to any disclaimer, the term of this patent is extended or adjusted under 35 U.S.C. 154(b) by 258 days.

(21) Appl. No.: 11/207,656

(22) Filed: Aug. 18, 2005

(65) Prior Publication Data

US 2006/0192132 A1    Aug. 31, 2006

Related U.S. Application Data

(62) Division of application No. 10/855,245, filed on May 27, 2004, now Pat. No. 7,005,782, which is a division of application No. 10/413,176, filed on Apr. 14, 2003, now Pat. No. 6,774,550, which is a division of application No. 09/390,841, filed on Sep. 7, 1999, now Pat. No. 6,590,324.

(51) Int. Cl.
*H01J 3/14* (2006.01)
*H01J 37/09* (2006.01)
*H01J 40/04* (2006.01)

(52) U.S. Cl. .................. 313/238; 313/240; 313/243; 313/292; 315/5.41; 250/440.11; 250/396 R (58) Field of Classification Search ............ 250/440.11, 250/396 R; 313/238, 240, 243, 292; 315/5.41
See application file for complete search history.

(56) References Cited

U.S. PATENT DOCUMENTS

| | | | |
|---|---|---|---|
| 3,683,463 | A | 8/1972 | Siefer et al. |
| 3,752,511 | A | 8/1973 | Racy |
| 3,864,797 | A | 2/1975 | Banks |
| 3,914,969 | A | 10/1975 | Banks |
| 4,082,052 | A | 4/1978 | Looks |
| 4,092,040 | A | 5/1978 | Tatina |
| 4,139,228 | A | 2/1979 | Varadi |

(Continued)

OTHER PUBLICATIONS

Technology and applications of broad-beam ion sources used in sputtering. Part I. Ion source technology, H.R. Kaufman, J. Vac. Sci. Technol., 21(3), Sep./Oct. 1982, pp. 725-736.

(Continued)

*Primary Examiner*—Nikita Wells
(74) *Attorney, Agent, or Firm*—Morgan & Finnegan, LLP (57) ABSTRACT

A charged particle apparatus, with multiple electrically conducting semispheric grid electrodes, the grid electrodes mounted in a dielectric mounting ring, with hidden areas or regions to maintain electrical isolation between the grid electrodes as sputter deposits form on the grid electrodes and mounting ring. The grid electrodes are mounted to the mounting ring with slots and fastening pins that allow sliding thermal expansion and contraction between the grid electrodes and mounting ring while substantially maintaining alignment of grid openings and spacing between the grid electrodes. Asymmetric fastening pins facilitate the sliding thermal expansion while restraining the grid electrodes. Electrical contactors supply and maintain electrical potentials of the grid electrodes with spring loaded sliding contacts, without substantially affecting the thermal characteristics of the grid electrodes.

8 Claims, 11 Drawing Sheets

U.S. PATENT DOCUMENTS

| | | | |
|---|---|---|---|
| 4,439,684 | A | 3/1984 | Hemmerich et al. |
| 4,447,773 | A | 5/1984 | Aston |
| 4,749,912 | A | 6/1988 | Hara et al. |
| 4,825,646 | A | 5/1989 | Challoner et al. |
| 4,870,284 | A | 9/1989 | Hashimoto et al. |
| 4,873,467 | A | 10/1989 | Kaufman et al. |
| 4,879,518 | A | 11/1989 | Broadhurst |
| 4,882,028 | A * | 11/1989 | Chhabra ................. 204/298.31 |
| 4,883,968 | A | 11/1989 | Hipple et al. |
| 4,917,044 | A | 4/1990 | Yau et al. |
| 5,220,126 | A | 6/1993 | Borgwarth et al. |
| 5,448,883 | A * | 9/1995 | Meserole et al. ............... 60/202 |
| 5,527,591 | A | 6/1996 | Crotzer et al. |
| 5,551,904 | A | 9/1996 | Hedges et al. |
| 5,559,391 | A * | 9/1996 | Valentian ................. 313/360.1 |
| 5,689,950 | A | 11/1997 | Smith |
| 5,718,831 | A | 2/1998 | Zigliotto |

OTHER PUBLICATIONS

Handbook of Ion Beam Processing Technology, J.J. Cuomo et al., Noyes Publications, pp. 8-20, 1989.

Broad-beam ion sources: Present status and future directions, H.R. Kaufman, J. Vac. Sci. Technol., A4, May/Jun. 1986, pp. 764-771.

Dished Accelerator Grids on a 30-cm Ion Thruster, V.K. Rawlin et al., J. Spacecraft, pp. 29-35, Jan. 1973.

Mercury Ion Thruster Technology, J.R. Beattle et al., NASA Lewis Research Center, Mar. 1989, pp. 63-84.

Thirty-Eight-Centimeter Ion Source, H.R. Kaufman et al., Nuclear Instruments and Methods in Physics Research, pp. 98-102, (Dec. 1989).

Feasibility Study of Large-Scale Rf-Ion Thrusters, H.W. Loeb et al., 41st Congress of the International Astronautical Federation, pp. 1-12, (Oct. 1990).

Development of Advanced Inert-Gas Ion Thrusters, R.L. Poeschel, NASA Lewis Research Center, Jun. 1983, pp. 64-74.

Developments in broad-beam, ion-source technology and applications, H.R. Kaufman, J. Vac. Sci. Technol., 21(3), Sep./Oct. 1982, pp. 764-767.

Operating Characteristics of a 15-cm-dia. Ion Engine for Small Planetary Spacecraft, J.R. Brophy et al., 23rd International Electric Propulsion Conference, Sep. 1993, pp. 1-9.

Ion Sources for Ion Machining Applications, H.R. Kaufman et al., AIAA Journal v.15 No. 6 Jun. 1977, pp. 843-847.

Primary Electric Propulsion Technology Study, R.L. Poeschel et al., NASA Lewis Research Center, Nov. 1979, pp. 127-178.

* cited by examiner

CHARGED PARTICLE BEAM EXTRACTION AND FORMATION APPARATUS

This is a divisional of application Ser. No. 10/855,245, filed May 27, 2004 now U.S. Pat. No. 7,005,782, which is a divisional of prior application Ser. No. 10/413,176, filed Apr. 14, 2003 which application is now U.S. Pat. No. 6,774,550, which is a divisional of Ser. No. 09/390,841, filed Sep. 7, 1999 which application is now U.S. Pat. No. 6,590,324.

FIELD OF THE INVENTION

The invention relates generally to the field of charged particle sources and more specifically to charged particle sources with grid electrode optics forming apertures for the charged particles.

BACKGROUND OF THE INVENTION

Gridded, broad-beam ion sources, first developed for ion propulsion engines for spacecraft, are used in a variety of applications, such as ion beam etching (IBE), ion beam sputter deposition (IBSD), materials modification, and nuclear fusion technology. Ions are usually extracted from a discharge plasma by multi-grid ion optics. The plasma generator and the ion optics assembly are the two major components of the broad-beam ion source.

The plasma is usually generated by a type of high voltage glow discharge, hot-cathode discharge, vacuum arc discharge, or RF discharge. Ions extracted from the plasma are accelerated and focused into an ion beam by applying relevant potentials to an electrode in contact with the plasma and other grid electrodes (ion optics). The optimum number of grid electrodes is defined by application requirements, such as cost, weight, sensitivity to contamination of exposed surfaces by grid material, and beam collimation.

For many ion beam etch and ion beam sputter deposition applications, grid assemblies which provide low ion beam divergence are needed. Grid assemblies using three or more grid electrodes are preferable for this purpose. Such grid assemblies are able to provide low beam divergence over a wide range of beam current and beam voltage (ion energy). In addition, when operated under proper conditions, grid assemblies with three or more grid electrodes are not subject to grid erosion from charge exchange ions generated in the ion beam. For comparison, one and two-grid systems are mechanically simpler but have a limited range of operation at low beam divergence and are subject to grid erosion. Consequently, three-grid ion optics, with longer grid life, are more compatible with high purity materials processing requirements.

In a three-grid assembly, the grid in contact with the plasma is conventionally called the screen grid, and has a positive potential close to the plasma potential that defines the ion energy. The next grid downstream in the beam usually is set at a negative potential, and is called an accelerator grid. For low beam divergence operation, the absolute value of accelerator potential should not be greater than 0.3 times the value of the screen grid potential. The third grid is most commonly connected to ground potential, as are the target and chamber components. The third grid is called the decelerator grid.

Ion Optics Design and Operational Considerations

In a majority of broad ion source applications for high throughput production processes (or high thrust ion engines), the plasma generator and the multi-grid optics assembly must provide high beam current density at the ion optics and beam target. In turn, the maximum ion beam current (Ib) is very sensitive to the total extraction voltage Vt, which is sum of absolute values of screen potential (Vs) and accelerator potential (Va), and the spacing between these grids (d). To a good degree of accuracy this dependence can be expressed by the Child-Langmuir equation, $Ib \sim (Vt)^{3/2}/d^2$. As illustrated, ion beam current is inversely proportional to the square of the grid spacing; smaller grid spacing produces significantly higher ion beam current.

In the technologies mentioned above, (IBE, IBSD, and ion thruster applications), the ion energy is relatively low and usually does not exceed approximately a few kilovolts. To achieve high ion beam densities and low beam divergence, the inter-electrode spacing in the grid assembly must be on the order of 0.5-2.0 mm. This small spacing must be maintained over large beam diameters, up to 50 cm and more. Furthermore, technological requirements for ion beam uniformity (1% or less) and beamlet divergence (less than 3-5 degrees half-angle) dictate tight tolerances for grid inter-spacing and hole alignment. Grid inter-spacing tolerance is typically ±0.050 to 0.10 mm over the entire grid assembly. Grid hole misalignment is maintained at less than 0.05 mm with a 2 mm grid hole diameter. Maintaining these tight tolerances requires strict manufacturing control coupled with exceptionally stable grid structures and mounting configurations. Providing and maintaining these demanding tolerances is substantially complicated by thermal gradients which can exist between the center and periphery of the grids and also between the grid electrodes and grid support components.

In addition to the need for accurate grid inter-spacing during manufacture, the ion optics are also subject to repeated operational thermal cycling between "hot" (plasma on) and "cold" (plasma off) states. In a design where the mounting portion of the grid assembly is placed outside of the plasma generator, the temperature gradients are great. It has been observed in this configuration for the temperature of the center portion of the grids as much as 200 degrees Celsius higher than the temperature of the outer diameter of the grids.

Different techniques have been proposed to improve the thermal and mechanical stability of grids. These techniques include holding the grids in tension, supporting the screen grid in its center by a post contained in the plasma generator, adding stiffening ribs and using inter-electrode support spacers. However, at present, a common technique to provide stability is by forming the grid electrodes in a dished hemispherical configuration. As a result of the three dimensional shape, a dished grid has different mechanical stability when compared to a flat grid. A dished grid also has different thermal characteristics when compared to a flat grid. One difference is that thermal deformation of a dished grid is more predictable in magnitude and direction.

In addition to different thermal and mechanical characteristics when compared to flat grids, dished grid assemblies are more appropriate for special applications where highly focused or defocused ion beams are required. Concave grids (where the dishing is toward the plasma source) produce a focused ion beam that can be used in ion beam sputter deposition systems with relatively small target areas and high density ion beams. On the other hand, convex grids (where the dishing is away from the plasma source) produce defocused beams used in ion beam processing systems, such as in substrate surface cleaning, when a relatively large substrate or target area is exposed to a low density ion beam.

With a flat peripheral area on the grid (either flat or dished grid with an outer flange), it is known to use relatively massive stiffening ring arrangements to support and stiffen the grid. These stiffening rings are also usually fabricated from the same material as the grids, and are fastened to the flat peripheral area of the grid. In turn, the grid stiffening rings are fastened to each other and/or to the grid mounting base with some form of fastener. The fasteners are varied and include rigid posts, screws, nuts, washers, insulating bushings, and "sputter cups." "Sputter cups" protect insulator surfaces from shorting out due to deposition of conductive materials. Because these designs have multiple parts and tend to be somewhat complex, they usually require some manual grid alignment, at least for initial set-up.

However, grid stiffening rings are exposed to rapid thermal transitions. It is commonly known that the relatively massive rings can introduce larger temperature gradients in the radial direction. In addition, if there is poor thermal contact between the edge of the grid electrode and the stiffening ring, a transient azimuthal temperature variation will occur. Nonuniformity in the temperature distribution can lead to grid distortion with consequent aperture misalignment and beamlet vectoring, which can cause ion impingement on the accelerator and decelerator grids. Finally, utilization of molybdenum stiffening rings appreciably increases the construction weight and cost.

It is also known to isolate the grid from the support structure with flexible supports. Presumably in this configuration, grid deformation is less influenced by the support structure. However, flexible grid margins and grid supports do not completely avoid problems associated with grid thermal expansion. During operation, radially and axially acting elastic forces can deform the grids and cause grid spacing deviation and misalignment.

It is also known to incorporate a "dog leg" or other bend profiles into the planar edge of the grid electrodes. Presumably, this is done to provide stiffness.

It is also known to profile the outer rims of the grids into a trapezoidal shape to define a space between them for insulating spacers. The flat portion of the profiled grid rims has plurality of slots. Ball-shaped insulating spacers are seated in these slots. Presumably, this configuration provides alignment of the grids and allows radial expansion.

It is also known to reduce the number of grid supports in an attempt to isolate the grid from the support. However, use of a limited number of grid supports (rigid or flexible) does not necessarily provide stable and uniform grid spacing as a function of the azimuthal angle.

Manufacture and Assembly Considerations for Ion Optics

The majority of dished grid optics are fabricated from cross rolled molybdenum sheets. The thickness of the sheet material depends on the hole machining technology used to form the grid. For conventional photochemical sheet etching to produce the grid hole pattern, the sheet thickness is in the range 0.2-0.5 mm. When the grid hole pattern is produced by drilling the sheets, the grid can be thicker. However, grid thickness is balanced with restrictions dictated by the ion optics and grid dishing technology. For some production applications, such as high rate ion beam sputter deposition, grid sheet material thickness in the range of 1 mm is practical.

In an operation that is separate from creating the grid hole pattern, the grid is typically dished by physical deformation. Numerous techniques have been employed to accomplish this deformation, including hammering, spinning, cold and hot pressing, and hydroforming.

For most grid deformation techniques to form a dished grid, a specially designed fixture is used to clamp the peripheral edges of the molybdenum grid sheets while deforming the center. One reason for clamping the edges is to keep the peripheral area of the dished grid as flat as possible. This region of the grids is typically used as part of the grid mounting.

When a grid is dished by clamping the periphery and deforming the center, the undished periphery is often distorted when the grid is unclamped. Depending on the dishing technology and condition (clamping method and force, grid and fixture temperatures and temperature gradients, material thickness, etc.) the periphery or flange is bent either toward or away from the grid central axis. In addition, the periphery can become wavy (uneven). Distortions extending into the periphery of the spherical surface of the dished portion of the grid have also been observed. A reason for distortion is the "spring back" which is caused by the internal stresses left in the transition region between the clamped peripheral flange and the dished spherical surface. To restore the spherical shape to the dished surface and flatness to the peripheral flange, the grids are typically stress-relieved. During the stress-relieving operation the grids are clamped in a fixture with spherical shaped dies and components made of a high temperature compatible material, such as graphite. This procedure does not always provide satisfactory results. If stresses are not fully relieved, they can be induced in the electrodes when they are clamped between the mounting rings or fastened to the flexible grid supports. Such stresses can lead to changes in the grid-to-grid spacing and hole misalignment under the thermal stress of ion source operation.

In most known grid assemblies, a plurality of components are used. These components define inter-electrode spacing and hole alignment. During production the plurality of components leads to tolerance buildup problems with associated inter-grid spacing deviations and hole misalignment.

In production applications of gridded ion sources, a critical requirement is grid hole alignment. Maintenance of the ion source is substantially simplified if the grid assembly leads to the proper hole alignment (e.g., a self-aligning grid assembly). Grid assembly designs using either massive and rigid supports, or flexible supports typically are not self-aligned constructions.

It is therefore an objective to provide a grid assembly design that is adaptable to both flat and dished grids. The design should avoid or reduce problems with manufacturing and operating stress in the peripheral region of a dished grid, and the design should be conducive to self-alignment of the individual elements of the assembly. The design should minimize the number of individual parts in the grid assembly. The design should allow use of lower cost materials. The design should include features to allow extended operational time without the need for cleaning or maintenance. The design should include materials that allow extended operational time without the need for cleaning or maintenance. The design should allow extended operation without the need for replacement of parts. The design should be scalable to support larger beams without compromising accuracy and performance.

SUMMARY OF THE INVENTION

In one embodiment, a grid electrode comprises a substantially solid outer region and a central region with openings. A plurality of asymmetric fastening slots are located in the outer region. The asymmetric fastening slots have a major and minor axis, with the major axis oriented toward the central region. The grid electrodes are planar or semispheric, and are electrically conductive.

In one embodiment, a grid mounting ring has a contact region and a hidden region, the hidden region formed by a recess or groove in the dielectric mounting ring. The hidden region has an aspect ratio of at least five (5) and preferably as much as ten (10). The mounting ring, contact region and hidden region is substantially circular. The mounting ring is a high temperature dielectric material.

In one embodiment, an electric contact in a holder has a high temperature spring bias for contact to a grid. The contact is molybdenum and the spring providing the spring bias is insulated from the holder.

In one embodiment, a fastening pin for the grid has an asymmetric head with major and minor axis dimensions. A shaft between the head and a shoulder has a smaller diameter than the shoulder. The diameter of the shoulder is larger than the major axis dimension of the head. Elastic members on an end of the pin opposite the head provide a radial spring force when the pin is installed. The diameter of the shaft is substantially equal to the minor axis dimension of the fastening slot of a grid electrode.

The figures are provided for illustration only and are not intended to limit the scope of the invention.

DETAILED DESCRIPTION OF THE INVENTION

In the present invention, the above-mentioned objectives are provided by a "flangeless" grid mounting design, which has the following features:

In the dished grid optics assembly only the spherical dished portion of the grid electrodes are used, i.e. the mounting flange is removed after the dishing operation. Thus the problems of distortion and residual stresses in the peripheral flange area produced during dishing are reduced or eliminated. The absence of a flange portion on a dished grid also allows the grid to expand and contract with minimal stress.

In one aspect of the grid assembly design, the grid electrodes are all supported by a common mounting ring. The mounting ring is a single piece and is fabricated from a material with low thermal and electrical conductivity, such as ceramic or quartz. The single piece mounting ring substantially supports the grids along their entire perimeter. To provide for electrical isolation of the grid potentials under exposure to sputter deposition from the plasma and processing chambers, the mounting ring, coupled with the grid provides a high aspect ratio channel along the grid contact perimeter. This high aspect ratio feature also reduces the contact area between the grids and the mounting ring and thereby prevents localized heat transfer between the electrodes via thermal conduction to the mounting ring. Provision for thermal expansion of the grids, to avoid or reduce grid warpage, is also an aspect of the mounting ring design.

The screen grid is uniformly exposed to the plasma thermal load. This aspect of the design helps to avoid thermal gradients that are known to cause warpage. The other grids, which are smaller in diameter than the screen grid and somewhat shielded by the screen grid, are therefore uniformly exposed to the radiant heat from the screen grid and plasma.

In one aspect of the grid assembly design, two components of the grid mounting hardware are primarily responsible for grid spacing and hole alignment. These components are the dielectric mounting ring and the fastening pins for attaching the individual grids to the mounting ring. Limiting the number of components for the grid assembly also greatly simplifies fabrication and reduces the fabrication and maintenance time.

In one aspect of the grid assembly design, the pins to fasten the individual grids to the mounting ring through the slots in the grid periphery are generally self-aligning. That is, there is no alignment tool or alignment procedure. Use of these pins and the pin installation tooling provides for simple grid fabrication during production.

In one aspect of the grid assembly design, a spring-loaded mechanism is used to make electrical contact to the grids without constraining the grid thermal expansion and contraction. The design helps to ensure that the spring is protected from overheating and annealing during operation.

Other features of the invention include: the design is easily scalable for grid assemblies with more than three grids (e.g., 4, 5 grid sets); concave, convex and flat grid configurations can be accommodated with similar hardware; and grid spacing can be changed, to accommodate different applications, by simply changing the dimensions of the ceramic mounting ring.

Figure 9:
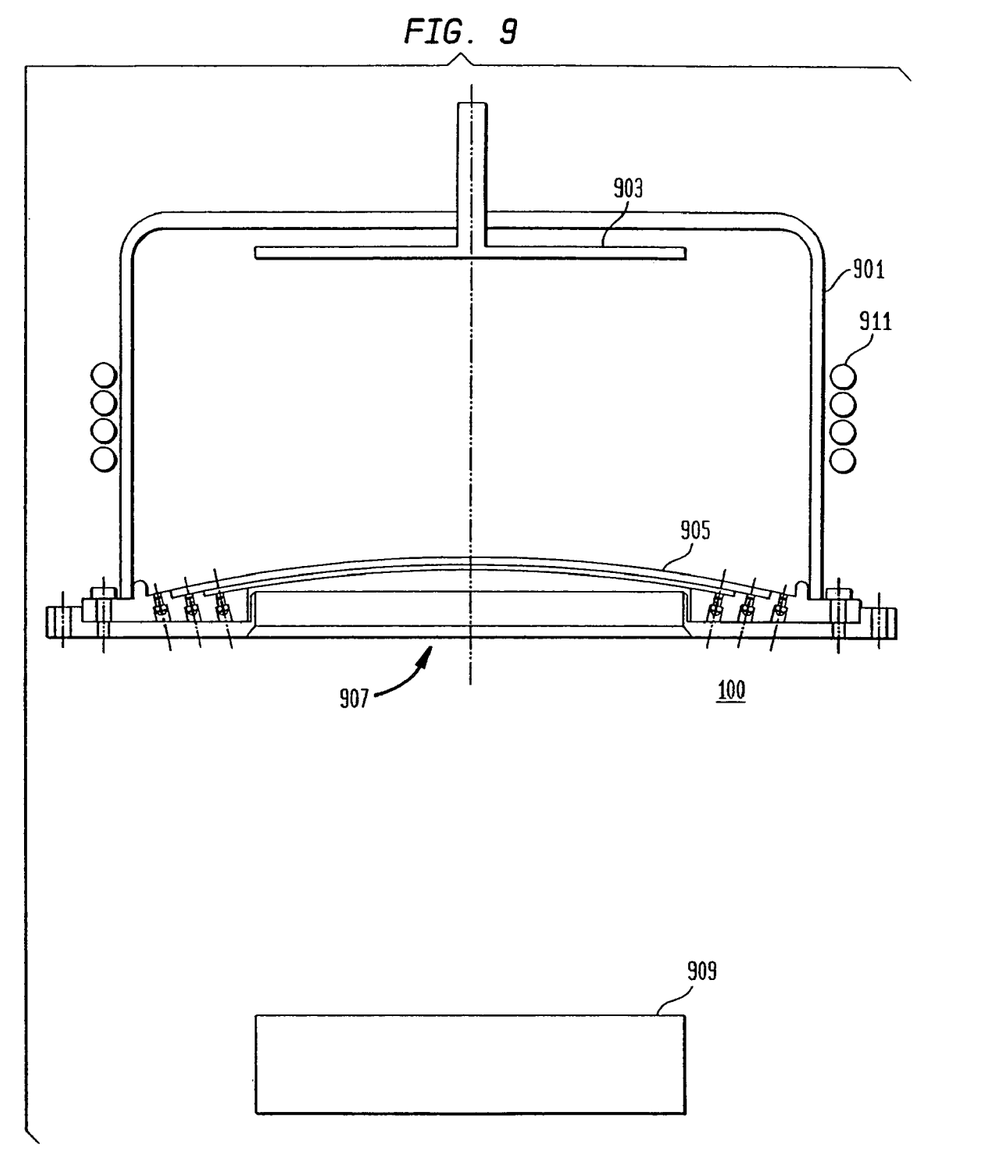
FIG. 9 illustrates a plasma containment apparatus.

Referring now to FIG. 9, a charged particle source 100 includes a containment vessel 901, a source electrode 903, a plurality of grid electrodes 905, the grid electrodes forming an aperture 907, through which charged particles are directed on a target 909 from the interior of vessel 901. Typically, the charged particle source is energized by an RF coil 911 surrounding vessel 901. A number of elements, such as gas inlet, electrical connections, fixtures, holders, beam shapers and the like, which are typically part of source 100 are not illustrated in FIG. 9. Most of the present invention concerns the physical configuration of grid electrodes 905, the supporting mounting for electrodes 905, connection of the grid electrodes to the supporting mounting, and the electrical connections to electrodes 905. These aspects are described in greater detail below. Typically, source 100 is a plasma source and will be described as such below.

As used in the specification and claims, the terms semisphere and semispheric refer to a surface that is spheric or substantially spheric, though not a complete sphere. Two semispheres are formed by intersecting a plane and a sphere and dividing the sphere into two parts at the intersection of the plane and sphere. Within the context of the specification and claims, the smaller of the two semispheres is preferred for the grid electrodes. For reference, a hemisphere is a semisphere, where the plane intersection divides the sphere equally into two semispheres.

FIGS. 1A-1D illustrate various elements of the grid assembly of the invention. The grid assembly includes three electrically conducting semispheric grid electrodes 101, 103, 105 connected to a dielectric grid mounting ring 107. The connection of grid electrodes 101, 103, 105 to ring 107 is by a plurality of fastening pins 109. Electrical connection to grid electrodes 101, 103, 105 is provided by three spring-loaded contacts within electrical contact assembly 111. The unique aspects of each of these elements are described in greater detail.

Grid Electrodes

As illustrated in FIGS. 2A-2D, grid electrodes 101, 103, 105 are semispheric with a differing radius of curvature for each element. As an example, for a grid material thickness of about 3.8 mm (0.015 inches), grid electrode 101 has an inner radius of curvature of about 508 mm (20.0 inches), while grid electrode 103 has an outer radius of curvature of about 506 mm (19.92 inches) and finally grid electrode 105 has an outer radius of curvature of about 504 mm (19.86 inches). These relationships allow semispheric grid electrodes 101, 103, 105 to "nest" within each other, maintaining a uniform separation between each grid electrode. Grid electrodes 101, 103, 105 also have a substantially smooth or continuous surface, without any rim, lip, stiffening ring or mounting ring around the edge or periphery of the grid electrodes. Such grids can be manufactured, for example, by the methods described in R. L. Poeschel, *Development of Advanced Inert-Gas Ion Thrusters*, NASA CR-168206, 1983. After manufacture, the flanges are removed. However, methods for grid manufacturing are not primary aspects of the instant invention.

This smooth or continuous flangeless grid surface allows grid electrodes 101, 103, 105 to uniformly expand and contract when heated and cooled during operation of source 100. Other known grid electrodes, such as illustrated in U.S. Pat. No. 4,883,968 to Hipple et al.; U.S. Pat. No. 4,749,912 to Hara et al.; and U.S. Pat. No. 4,439,684 to Hemmerich et al. disclose a discontinuous grid electrode with a rim, lip, flange, or stiffening ring. A discontinuous grid surface creates a restraint on the uniform expansion and contraction of grid electrodes during operation of a charged particle source. As previously described restrained or non-uniform expansion and contraction of individual grid electrodes can alter inter-grid spacing. This change in spacing between grid electrodes results in a loss of control of the particle flux distribution.

As illustrated in FIGS. 2A-2D, grid electrodes 101, 103, 105 are also different diameters, to coordinate with the mounting ring described below. As an example, grid electrode 101 is about 239 mm (9.4 inches) in diameter, while grid electrode 103 is about 208 mm (8.2 inches) in diameter and finally grid electrode 105 is about 183 mm (7.2 inches) in diameter. This inverted stair-step arrangement makes it possible for the largest grid electrode 101 and mounting area to be uniformly exposed to the plasma contained within vessel 901. This minimizes thermal gradients that can cause thermal stress and resultant mechanical distortion of the grids. Similarly, this allows grid electrodes 103 and 105 to be uniformly exposed to the radiant heat transfer from grid electrode 101.

During operation of source 100, the ion optics extract charged particles from the inside of vessel 901 by accelerating the particles toward aperture 907. This is accomplished predominantly by the electrical bias or potential of grid electrodes 101, 103, 105. As an example, grid electrode 101 is biased with an electrical potential of +1000 v, grid electrode 103 is biased at −100 v, and grid electrode 105 is biased at 0 v. These electrical potentials create electrical fields by which the charged particles are extracted from vessel 901 through the grid openings within the patterned region 201 of grid electrodes 101, 103, 105. These grid openings are aligned so that particles can pass from the interior of vessel 901 through grid electrodes 101, 103, 105 in a particular defined trajectory.

In one embodiment, there are about 3210 grid openings in each of grid electrodes 101, 103 and 105. In grid electrode 101, each grid opening is about 2.0 mm in diameter. Similarly, in grid electrode 103, each grid opening is about 1.3 mm in diameter. Finally, in grid electrode 105, each grid opening is about 1.8 mm in diameter. Each of the grid openings in grid electrodes 101, 103, 105 are aligned with respective grid openings in the other grid electrodes. This alignment is similar to the alignment illustrated and described at page 75 of J. R. Beattie & J. N. Matossian, *Mercury Ion Thruster Technology*, NASA CR-174974, 1984.

While the patterned region 201 of grid electrodes 101, 103, 105 has a plurality of grid openings, outer region 203 is substantially solid and provides stability for grid electrodes 101, 103, 105 while providing a mounting surface for contacting mounting ring 107 as discussed below. Connections between grid electrodes 101, 103, 105 and mounting ring 107 are accomplished by a plurality of asymmetric through openings or slots 205 around the periphery of outer region 203.

In one embodiment, each grid electrode has twelve (12) equally spaced fastening slots 205. Fastening slots 205 are about 2.1 mm by 3.0 mm (0.083 by 0.120 inches) with the larger or major axis dimension oriented toward the center of the semispheric grid electrode. Slots 205 of grid electrodes 101, 103, 105 are offset above each other. Smooth unrestricted expansion and contraction of the grid electrodes is facilitated by the combination of: slots for connection of grid electrodes 101, 103, 105 to mounting ring 107 by fastening pin 109, and the lack of stiffening rings or flanges on the grid electrodes. Slots 205 also advantageously prevent rotary movement (i.e., movement in the azimuthal direction) of grid electrodes 101, 103, 105, thereby maintaining accurate rotational alignment of the plurality of grid openings in central region 201. By closely constraining grid electrodes 101, 103, 105 in a rotational direction, but allowing radial expansion and contraction, alignment of grid openings is more accurate, and spacing between grid electrodes is more uniform during operation. This increased control of ion optic parameters allows a more repeatable and stable control of the particle flux on a target.

Figure 1A:
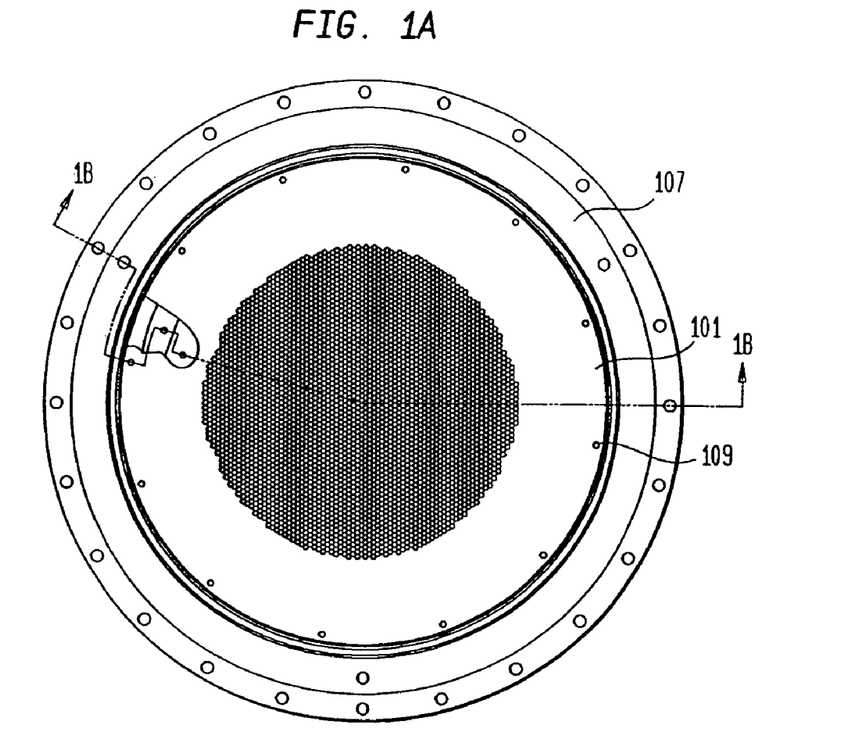
FIG. 1A illustrates grid electrodes, a mounting ring and an electrical contactor assembly in a grid assembly.
Figure 1B:
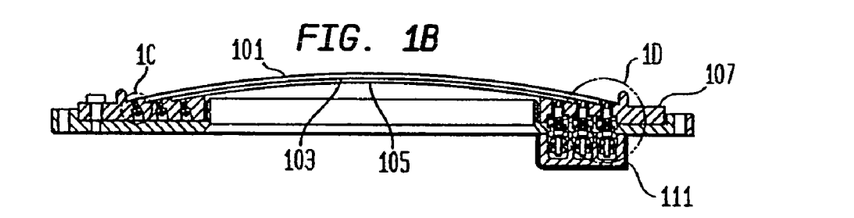
FIG. 1B illustrates a cross-sectional view of the grid electrodes, mounting ring and electrical contactor assembly, as indicated in FIG. 1A.
Figure 1C:
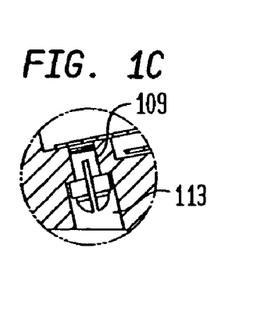
FIG. 1C illustrates an enlarged view of a portion of FIG. 1B, as indicated therein.
Figure 1D:
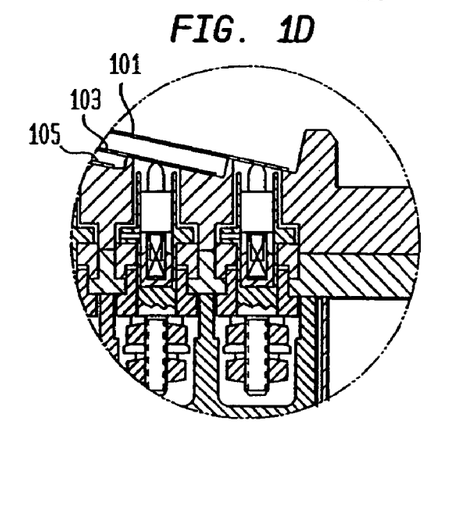
FIG. 1D illustrates an enlarged view of a portion of FIG. 1B, as indicated therein.
Figure 2A:
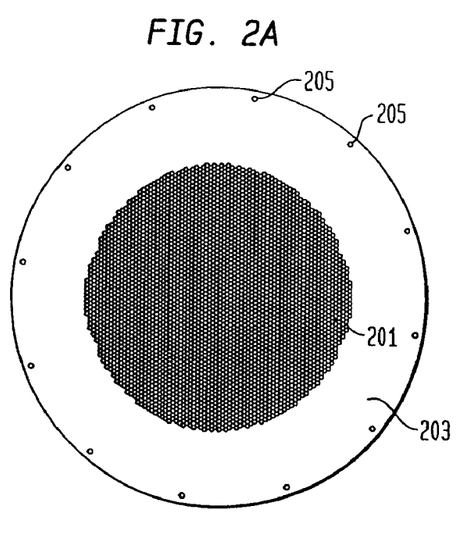
FIGS. 2A-2D illustrate grid electrodes.
Figure 2B:
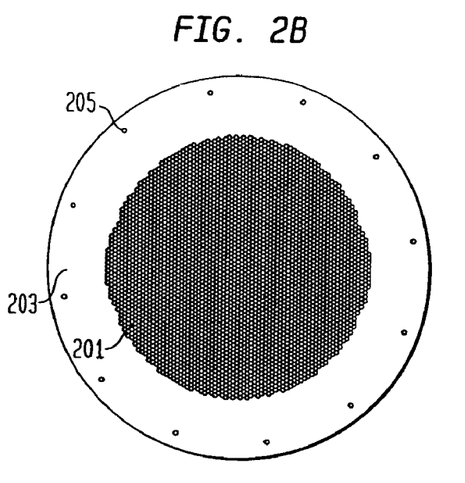
Figure 2C:
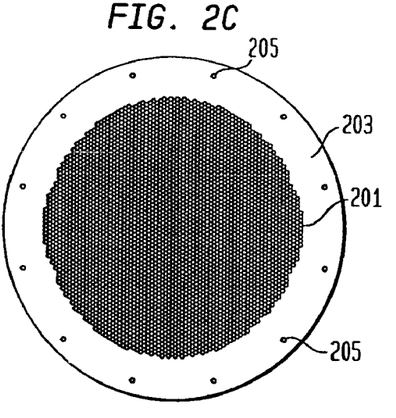
Figure 2D:
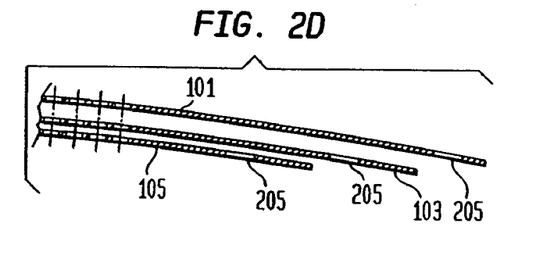
Figure 3A:
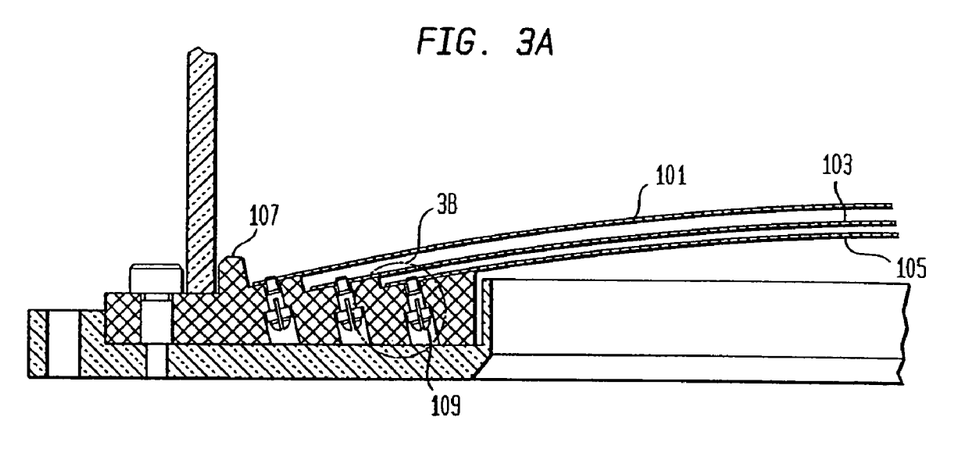
FIG. 3A illustrates concave semispheric grid electrodes with mounting ring and fastening pins.
Figure 3B:
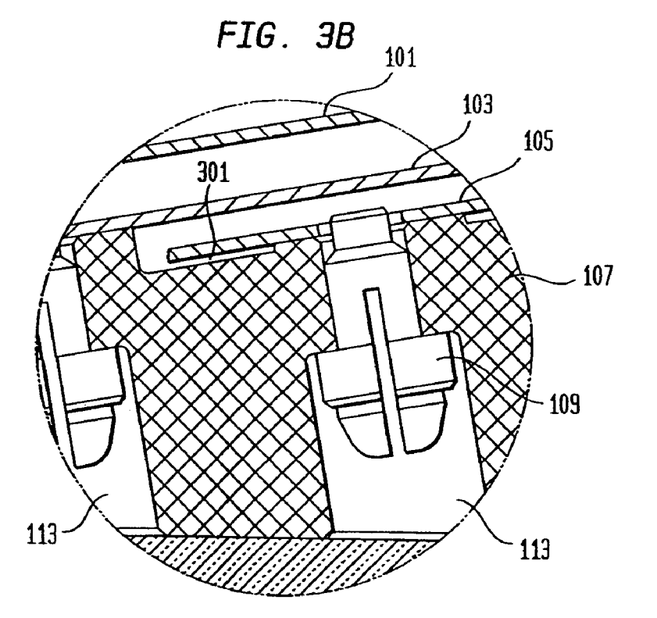
FIG. 3B illustrates an enlarged view of a portion of FIG. 3A, as indicated therein.

FIGS. 3A and 3B illustrate semispheric grid electrodes 101, 103, 105 in relationship to mounting ring 107, with fastening pins 109, where the grids are concave dished to form a focused ion beam.

Figure 4A:
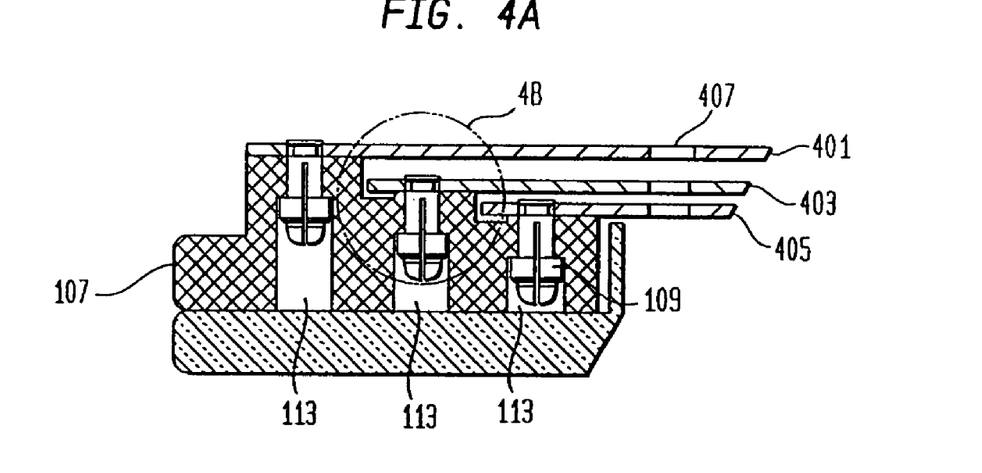
FIG. 4A illustrates planar grid electrodes with mounting ring and fastening pins.
Figure 4B:
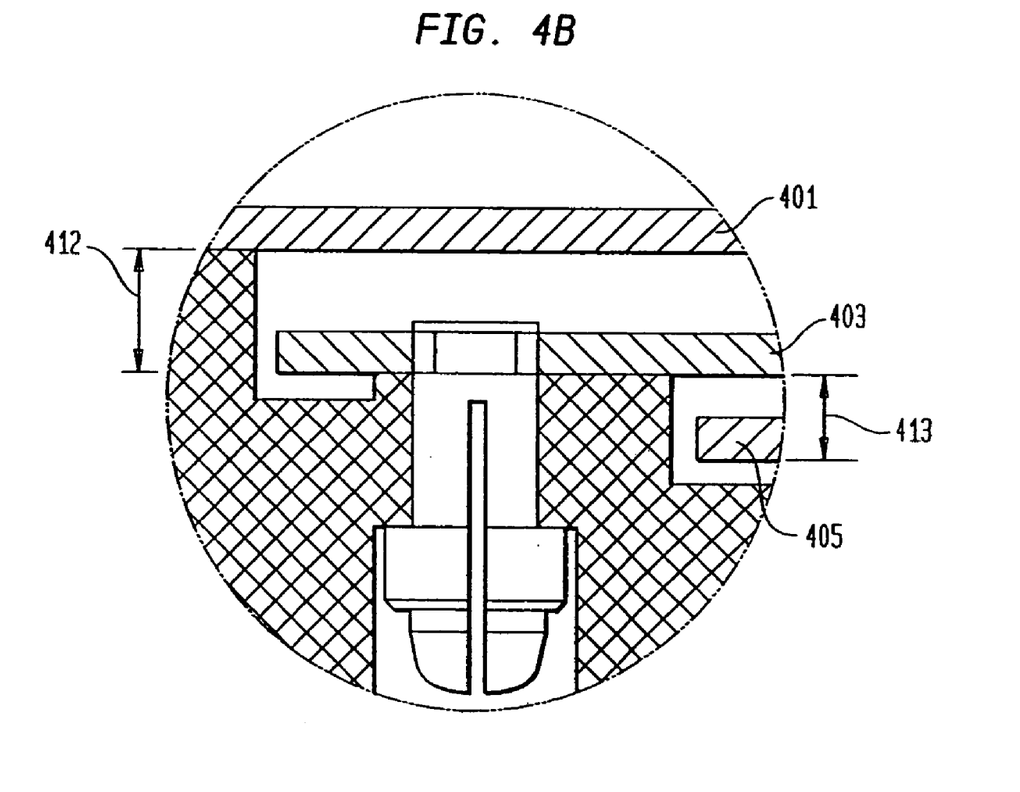
FIG. 4B illustrates an enlarged view of a portion of FIG. 4A, as indicated therein.
Figure 5A:
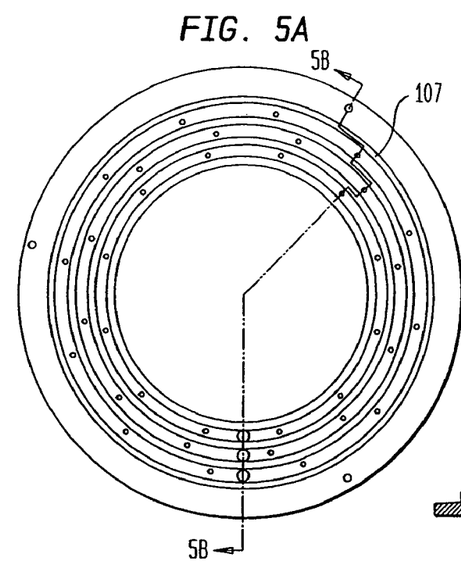
FIG. 5A illustrates a mounting ring.
Figure 5B:
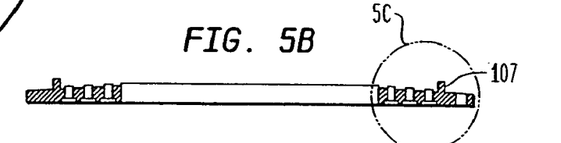
FIG. 5B illustrates a cross-sectional view of a mounting ring, as indicated in FIG. 5A.
Figures 5C, 5D:
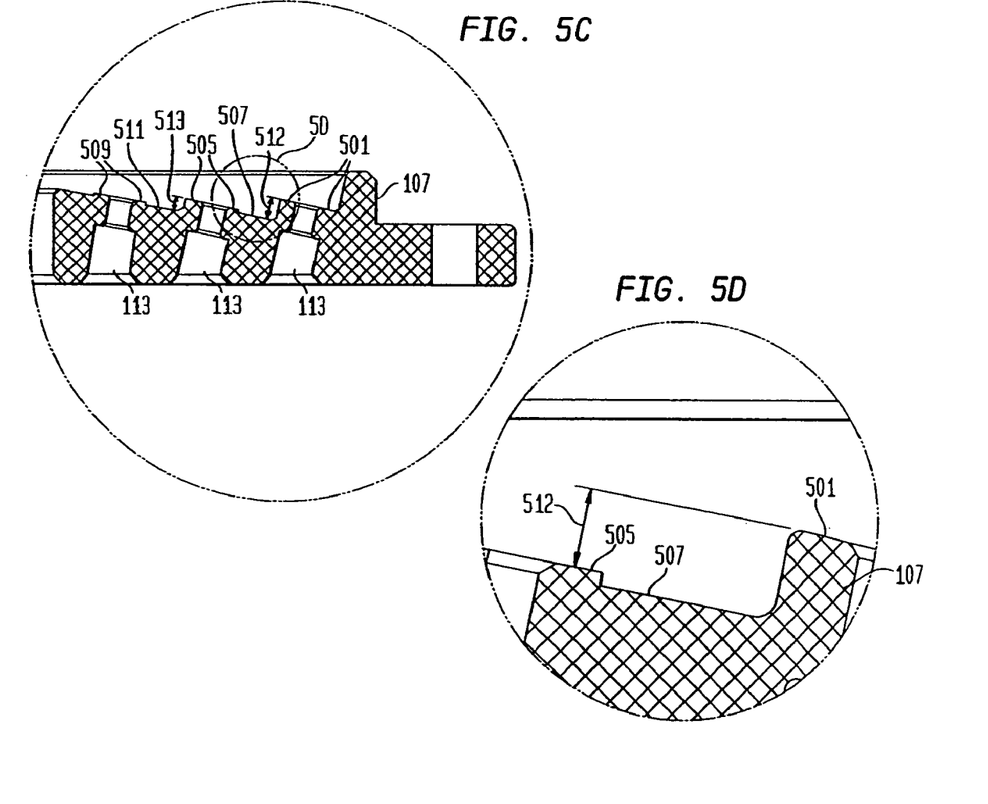
FIG. 5C illustrates an enlarged view of a portion of FIG. 5B, as indicated therein.
FIG. 5D illustrates an enlarged view of a portion of FIG. 5C, as indicated therein.
Figure 6A:
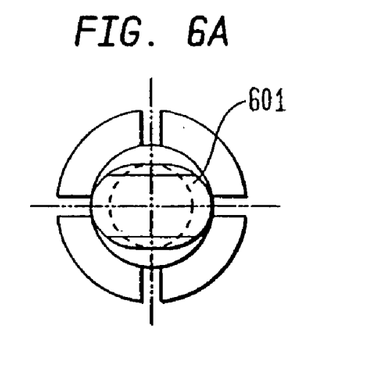
FIGS. 6A-6D illustrates a fastening pin.
Figure 6B:
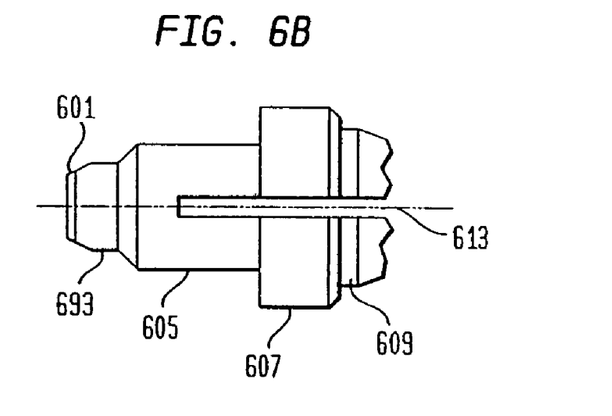
Figure 6C:
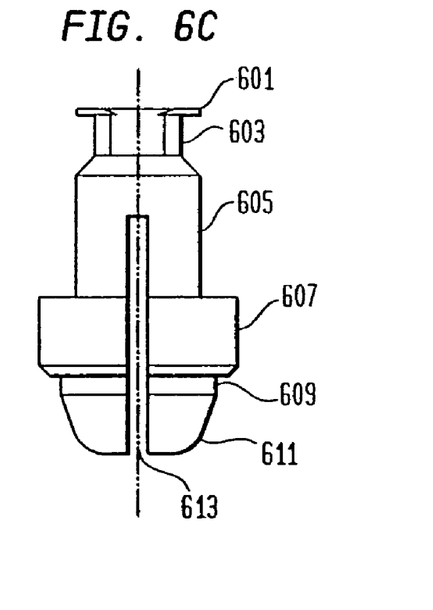
Figure 6D:
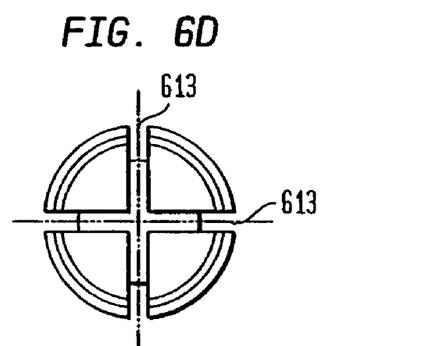

FIGS. 4A and 4B illustrate another embodiment where grid electrodes 401, 403 and 405 are planar or flat. An example of the relationship and alignment of an aligned grid opening 407 in grid electrodes 401, 403, 405 is also illustrated.

Figure 10A:
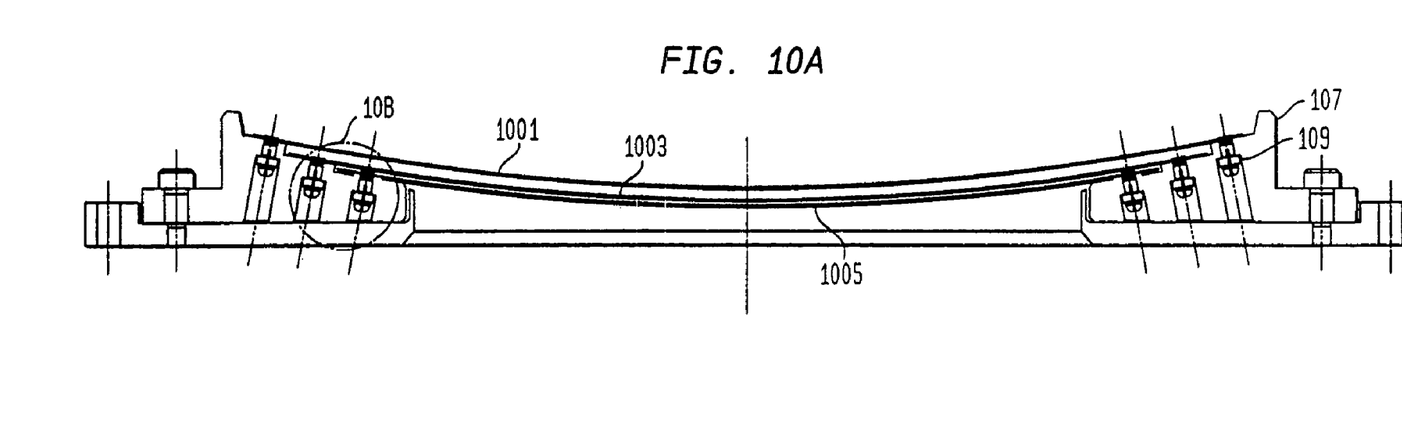
FIG. 10A illustrates convex semispheric grid electrodes with mounting ring and fastening pins.
Figure 10B:
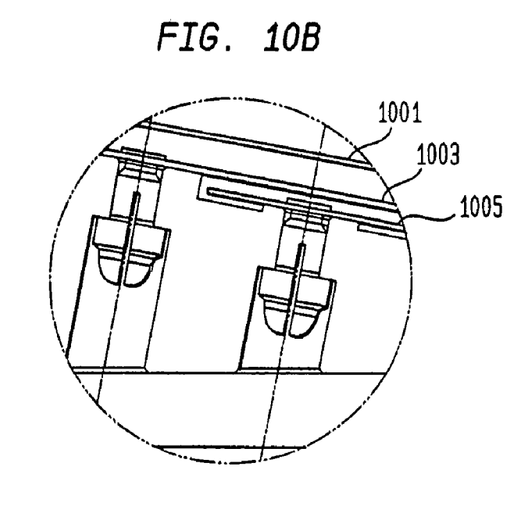
FIG. 10B illustrates an enlarged view of a portion of FIG. 10A, as indicated therein.
Figure 11A:
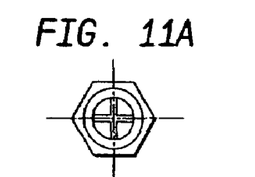
FIGS. 11A-11E illustrates a fastening pin installation tool.
Figure 11B:
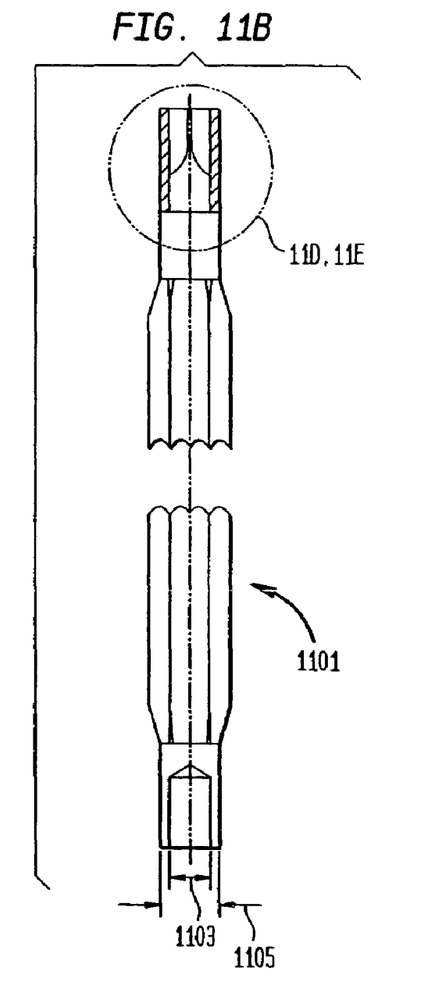
Figure 11C:
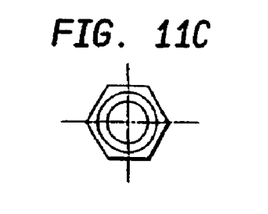
Figure 11D:
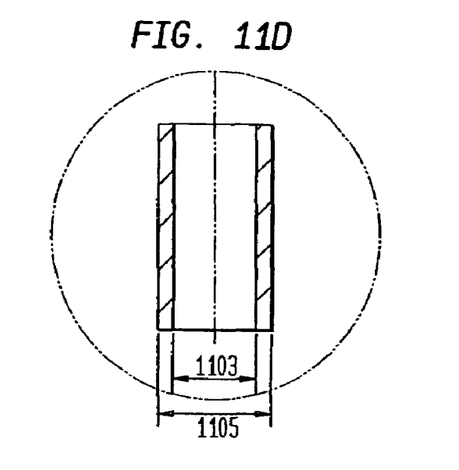
Figure 11E:
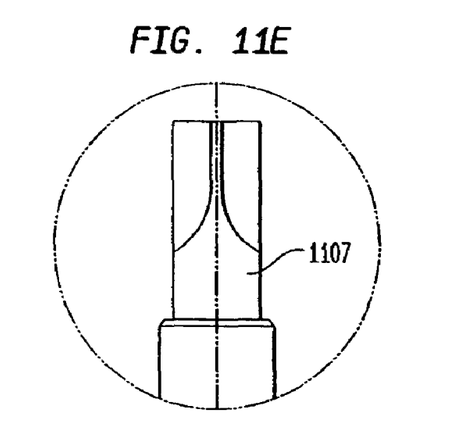

FIGS. 10A and 10B illustrate yet another embodiment where the semispherical grid electrodes 1001, 1003, and 1005 are convex dished to form a defocused ion beam.

Grid electrodes 101, 103, 105 are electrically conducting and preferably have a low coefficient of thermal expansion. Additionally, the composition of the grid electrodes is selected so that any material sputtered from the grid electrodes during operation of source 100 does not significantly contaminate the plasma or process. Preferably, grid electrodes 101, 103, 105 are composed of molybdenum rolled to a thickness of about 0.38 mm (0.015 inches). This allows chemical etching of the grid openings. Flat grid electrodes are typically about 1.0 mm (0.040 inches) thick and the grid openings are machined.

Mounting Ring

Electrically conducting grid electrodes 101, 103, 105 are connected to dielectric mounting ring 107 with the previously described slots 205 and fastening pins 109. Referring to FIGS. 5A-5D, mounting ring 107 is illustrated in cross-section. For mounting of grid electrode 101, ring 107 has a short stepped contact region 501 which supports the grid electrode and makes substantially continuous contact around the periphery of grid 203. For mounting of grid electrode 103, ring 107 has a contact region 505, but also has a hidden area or region 507. Grid electrode 103 makes substantially continuous contact around the periphery of outer region 203 with contact region 505. However, there is no contact between hidden area or region 507 and grid electrode 103. There is a similar contact region 509 and hidden area or region 511 corresponding to grid electrode 105. Grid electrode fastening slots 205 are aligned with corresponding mounting ring holes 113. Similarly, mounting rings for use with other multiple grid assemblies may be fabricated with more, or less steps and contact regions.

Grid electrodes 101, 103, 105 are different diameters with different semispheric radius. The contact regions of ring 107 corresponding to grid electrodes 101, 103, 105 are similarly different diameters and semispheric radius. For ease of fabrication, short contact regions 501, 505, 509 are substantially conical as a good approximation to the semispherical surface of the grids. The contact regions have different cone angles corresponding to the different angles of the outer region 203 of the respective grid electrode.

The spacing between grid electrodes is a key factor in determining the ion optic performance, in particular the particle flux distribution in the beam. In prior art designs for production applications this spacing is a function of the dimensions of a number of different parts, including multiple individual ceramic isolators. In the instant invention, the spacing between grid electrodes 101 and 103 at the peripheral region of the grids 203 is uniformly fixed by the height of step 512 in the mounting ring and the thickness of grid 103. Similarly, the spacing between grid electrodes 103 and 105 is determined by step height 513 and the grid 105 thickness. The dimensions of the fastening pins 109 also slightly affect the grid to grid spacing. This is because, in order to allow for expansion and contraction of the grids 101, 103, 105, the grids are not forced into contact with the surface of the mounting ring. The maximum gap between the grid-mating surface and the mounting ring is determined by the length of the fastening pin. However, the design should not allow this gap to be greater than about 0.02-0.05 mm (0.001-0.002 inches). In any case, the small number of parts involved in the grid spacing allows for easy control and inspection of this key factor. Referring to FIGS. 4A and 4B, in one example of the invention using flat grids, spacings of 2.0 mm between grids 401 and 403 and 1.0 mm between grids 403 and 405 are desired. Assuming all grids are in contact with the mounting ring and grids 403 and 405 are 1.0 mm thick, step 412 is about 3.0 mm and step 413 is about 2.0 mm.

Hidden regions 507, 511, in conjunction with mounting ring 107 and grid electrodes 103, 105 help to maintain electrical isolation between grid electrodes 101, 103, 105 during operation of source 100. It is known that during plasma operations, deposits are formed by sputtering on parts of source 100. Sputter deposits can originate from the target as well as parts of the source or grid electrode. As the thickness of sputter deposit increases, it is possible that it will create a partially conducting layer. If this layer forms a connection between grid electrodes, which have a potential of, for example 1100 v across them, it is possible that the deposited layer will form a circuit, leading to resistive or direct shorts between grid electrodes. It is also known that arrangement of "hidden" areas with certain aspect ratios (ratio of depth to width of the cavity opening) in plasma systems reduce the rate of formation of deposits within the cavity. FIGS. 3A and 3B illustrate a hidden area with respect to grid 105 in the instant invention. Hidden area 301 is the space between grid 105 and mounting ring 107, that is "hidden" from the plasma. There are formulae providing suitable aspect ratios for different plasma system operating parameters, but generally a cavity with an aspect ratio of five (5) and preferably ten (10) or greater will significantly reduce formation of deposits. An aspect ratio greater than ten (10) virtually eliminates deposits in the hidden cavity.

In an embodiment, the hidden region cavity depth is about 5.0 mm (0.200 inches) while the hidden region cavity width is about 0.38 mm (0.015 inches). This produces an aspect ratio of about thirteen (13) for the hidden regions corresponding to grid electrodes 103 and 105. The resulting hidden regions for grid electrodes 103, 105 help to maintain the electrical isolation of grid electrodes 101, 103 and 105 and thus allow source 100 to operate for longer periods without maintenance or cleaning to remove deposition from the surface of the dielectric ring around the grid electrodes.

Mounting ring 107 is preferably a high-temperature dielectric having low thermal conductivity. In one embodiment, it is a ceramic material able to withstand wide temperature variation with minimal long term effect. Preferably, ring 107 has a coefficient of thermal expansion that is comparable to the coefficient of thermal expansion for grid electrodes 101, 103, 105, thereby allowing the grid assembly to expand and contract uniformly. However, where the mounting ring and grid electrodes have different rates of thermal expansion, the slotted mounting configuration can accommodate the differential expansion and contraction. Mounting ring 107 is any hard high-temperature dielectric that has good machining characteristics (e.g., $Al_2O_3$). In one embodiment, mounting ring 107 is a ceramic consisting of alumina 99.5% or greater.

Fastening Pin

Slots 205 in grid electrodes 101, 103, 105 are used to connect the grid electrodes to mounting ring 107 with fastening pins 109. FIGS. 3A and 3B show the relationship between grid electrodes 101, 103, 105, mounting ring 107 and fastening pins 109. FIGS. 6A through 6D illustrate fastening pin 109 in greater detail. At the end of pin 109 that engages the grid electrodes, an asymmetric head 601 cooperates with slots 205. Directly below asymmetric head 601 is first symmetric shaft 603. Directly below first symmetric shaft 603 is second symmetric shaft 605. The tolerance between symmetric shaft 605 and mounting ring holes 113 is tight, allowing second symmetric shaft 605 to cooperate closely with mounting ring holes 113 in mounting ring 107. Directly below second symmetric shaft 605 is shoulder 607. Directly below shoulder 607 is third symmetric shaft 609. Finally, directly below third symmetric shaft 609 is taper 611, which is at the opposite end of pin 109 from asymmetric head 601. Pin 109 has two orthogonal longitudinally splits 613 beginning at the taper 611 end and extending through third symmetric shaft 609, shoulder 607 and into second symmetric shaft 605.

The configuration and dimensions of fastening pin 109 allows a snug interference fit between second shaft 603 and the minor axis of slot 205 in grid electrodes 101, 103, 105. Pin 109 is engaged with slot 205 of the grid electrodes by inserting pin 109 through a mounting ring hole 113 of mounting ring 107 and orienting asymmetric head 601 and slot 205 of the grid electrode so that the major axis of each is aligned. In this alignment, asymmetric head 601 can pass through slot 205. Once asymmetric head 601 is through slot 205, pin 109 is rotated by approximately one quarter turn or 90 degrees so that the major axis of pin 109 and slot 205 are no longer aligned. This rotation has the effect of preventing the grid electrode from disengaging from pin 109. Because pin 109 is retained in ring 107 by shoulder 607, rotation also has the effect of connecting the grid electrode to the mounting ring.

The distance from the bottom of asymmetric head 601 to shoulder 607 is such that the grid electrode is held snugly in contact with mounting ring, but not so snugly that movement between the grid electrode and mounting ring is prevented. This allows the grid electrode to slip or slide over the mounting rings during thermal expansion and contraction.

Rotation and securing of pin 109 in mounting ring 107 is accomplished by the combination of shafts 605, 609 shoulder 607, tapered end 611 and splits 613. Referring to FIGS. 11A through 11E, a pin installation tool 1101, comprising essentially a rod with a tubular end with inner diameter 1103 close to the diameter of symmetric shaft 609 and tube outer diameter 1105 slightly less than the diameter of shoulder 607 is used to slightly compress the four prongs of pin 109 by sliding the installation tube over taper 611 and over shaft 609 until the tube end abuts shoulder 607. The tube has the effect of compressing the split parts of shaft 605, thereby allowing pin 109 to be easily inserted in mounting hole 113 of mounting ring 107. The rod 1101 also includes a cross head 1107 on its other end, which can be used as an alternative for rotational alignment of asymmetric head 601 of pin 109 with slot 205 and a subsequent 90 degree rotation of pin 109 after engaging the grid electrodes with asymmetric head 601. Once pin 109 is installed, pin installation tube 1101 is pulled off the pin. Removing the pin installation tube allows pin 109 to expand and create a friction fit between the pin and mounting hole 113. Removal of pin 109 is essentially the reverse of the installation process.

Splits 613 also allow the tapered end of pin 109 to be slightly sprung, thereby increasing the grip or friction between pin 109 and mounting hole 113. This is accomplished by separating the four parts of taper 611 just beyond the elastic limit until the yield point is exceeded, resulting in a slight expansion of shaft 605 along its diameter.

In one embodiment asymmetric head 601 has a major axis dimension of about 3.0 mm (0.118 inches) and a minor axis dimension of about 2.0 mm (0.080 inches), the major and minor axis orthogonal to each other. Symmetric shaft 603 has a diameter of about 2.1 mm (0.082 inches), which is substantially the same as the minor axis dimension of slot 205 in grid electrodes 101, 103, 105. Symmetric shaft 605 has a diameter of about 3.0 mm (0.118 inches), which is slightly less than the diameter of mounting hole 113 in mounting ring 107. Shoulder 607 has a diameter of about 4.8 mm (0.188 inches), which is larger than the diameter of shaft 605. Symmetric shaft 609 has a diameter of about 3.9 mm (0.152 inches), which is less than the diameter of shoulder 607. Taper 611 has a taper angle of about 20 degrees.

The lengths of shafts 603 and 605 are selected so that grid electrodes 101, 103, 105, when secured to mounting ring 107 by pin 109 in mounting holes 113, are connected or held in a substantially fixed position with relation to mounting ring 107. However, the connection is not so tight that grid electrodes 101, 103, 105 are unable to slide with relation to mounting ring 107 as thermal changes during operation of source 100 cause grid electrodes 101, 103, 105 to expand and contract.

Pin 109 is preferably a metallic compound or alloy with stable elasticity features, and is selected so that it will not contribute substantially to contamination of the plasma if material is sputtered or heated during operation of system 100. Typically, pin 109 is 304 stainless steel or Inconel alloy.

One factor in the ion optic design of the instant invention is the inter-grid alignment. The instant invention provides a generally "self-aligning" design. (i.e., a special procedure to adjust the grid positions and mutually align the openings in each of the grids is generally not required.) A "self-aligning" design avoids special alignment procedures, which are burdensome in production operations and introduce additional possibility for error. Grid openings with different sizes are common in ion optics. The self-aligning design of the instant invention also generally avoids special alignment procedures, which can be difficult to perform with different size grid openings.

In the instant invention, grid alignment tolerances are determined by the location of the mounting holes 113 in the mounting ring, the location and dimensions of the grid slots 205, and the dimensions of the fastening pin shafts 603 and 605.

Although some known designs claim to be "self-aligning", typically in those cases the dimensions of a larger number of components of the grid mounting assembly will affect the alignment. Either all of these dimensions must be held to very tight tolerances, at a high cost, or the allowed tolerance of misalignment is relatively high. Also, with a larger number of critical components, it is harder to control the grid alignment in a grid assembly production operation.

Electric Contact Assembly

Grid electrodes 101, 103, 105 are electrically conducting and are mounted in mounting ring 107, which is a high-temperature dielectric. Grid electrodes 101, 103, 105 are also maintained at different electrical potentials. In order to realize the previously described advantages of the invention, those electrical potentials must be applied and maintained on the grid electrodes without thermal or mechanical stresses on the grid electrodes. As previously discussed, traditional techniques for electrical connection to grid electrodes include welded contacts, screwed contact connectors and other similar devices and techniques. Each of these known techniques has the disadvantageous effect of inhibiting free thermal expansion and contraction of the grid electrode, and mechanically distorting the grid electrode. As illustrated in FIGS. 1A through 1D, the electric contact assembly 111 of the invention provides an electrical contact for each grid electrode while minimizing these disadvantageous effects.

Figure 7:
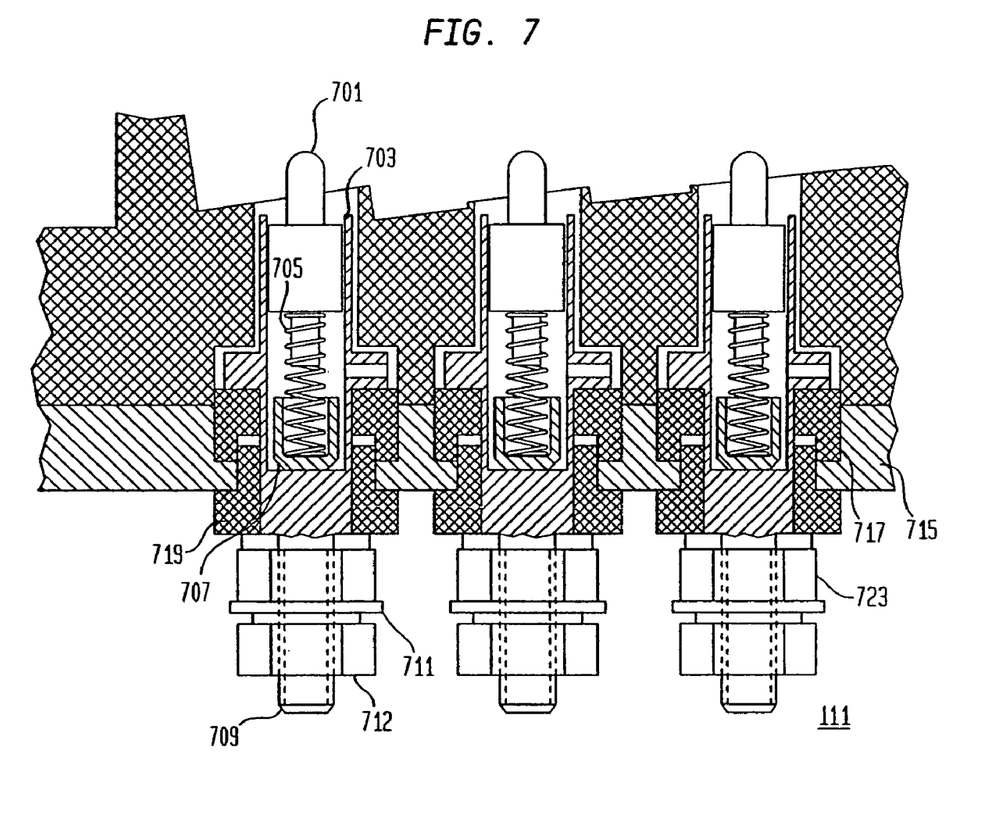
FIG. 7 illustrates an electrical contactor assembly.
Figure 8:
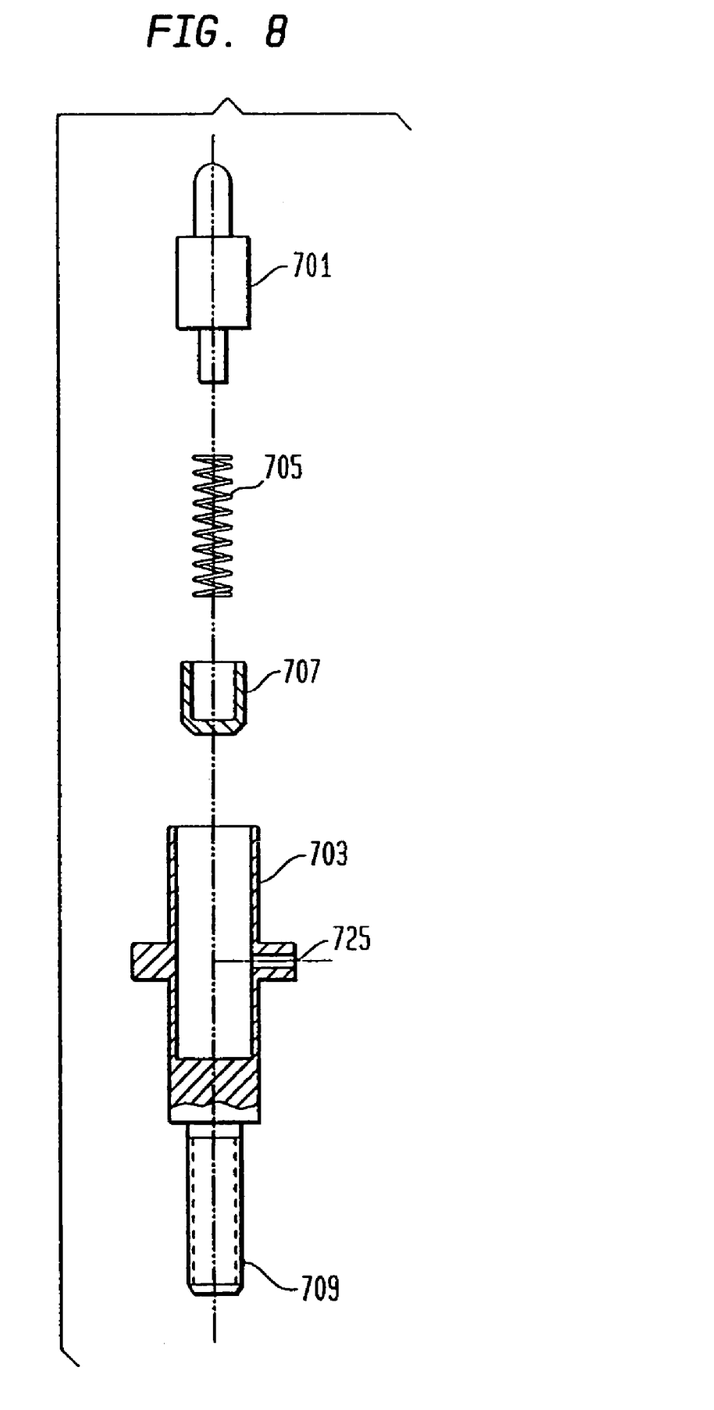
FIG. 8 illustrates an electrical contactor, contactor holder, & insulator cup.

Referring to FIGS. 7 & 8, electric contact assembly 111 is illustrated. Contact assembly 111 consists of contactors 701 which are spring loaded in contactor holder 703. Spring 705 provides spring loading and is insulated from contactor holder 703 by insulator cup 707. Contactor holder 703 has a power or electrical connector 709 at one end, opposite from the end holding contactor 701. Electrical connector 709 is connected to the electrical potential for each grid electrode. The source of the electrical potential is connected to electrical connector 709 by a suitable means such as screw or a lug 711 and lugnut 712. Electrical contact to contactor 701 is achieved as a result of the sliding contact between contactor 701 and contactor holder 703. Electrical conduction is facilitated by a close sliding fit between contactor 701 and contactor holder 703 and the material composition of each.

Metal backing ring 715 provides support for electrical contact assembly 111. Metal backing ring 715 is insulated from contactors 701 and contactor holders 703 by dielectric bushings 717 and 719. Contactors 701 are fastened to metal backing ring 715 with mounting nut 723. Contactors 701 extend through grid mounting ring 107 to contact grids 101, 103 105.

Insulation of spring 705 from contactor holder 703 with insulator cup 707 ensures that current can not flow from contactor holder 703 to contactor 701 through spring 705. This eliminates the possibility that resistive heating will anneal spring 705.

Contactor 701 slides in contactor holder 703 and makes sliding contact with the grid electrode, ensuring that the potential applied to electrical connector 709 is present at the grid electrode. Electrical contact between contactor 701 and the grid electrode is achieved by the round shape of the contact surface of contactor 701. This round surface is spring loaded on the grid electrode by spring 705, but the round surface is able to slide on the grid electrode as the grid electrode expands and contracts with operation of source 100. A small contact area, resulting from the round contact surface of contactor 701 helps to reduce heat transfer effects through contactor 701 from the grid electrodes into spring 705. Additionally, a round contact surface more easily slides on the grid electrode as the grid electrode expands and contracts during operation.

Contactor holders 703 include vent hole 725, to ensure effective venting during vacuum evacuation of source 100.

In one embodiment, contactor 701 is molybdenum, and contactor holder 703 is 304 stainless steel. The outer diameter of contactor 701 that makes sliding electrical contact with contactor holder 703 is about 3.8 mm (0.151 inches), while the inner diameter of contactor holder 703, that makes contact with contactor 701 is about 4.0 mm (0.156 inches). Insulator cup 705 is a dielectric ceramic cup of 95% alumina. Spring 705 is fabricated from a metal with a high anneal temperature, such as Inconel.

Whereas spring-loaded contacts are known in the art, the known designs have been somewhat unreliable for making electrical contact to ion source grid electrodes. After a number of process cycles, the electrical contact is lost or becomes poor due to softening of the spring through annealing. Annealing is avoided in the instant design by isolation of the spring from the electrical current path.

The spring force of spring 705 is also an important design consideration. The spring must provide sufficient force to maintain electrical contact to the grids. However, the spring must not significantly deform the grid during operation. Accordingly, the spring force should be selected so as to limit grid deformation to less than 0.05 mm (0.002 inches.)

The spheric shape of contactor 701, at the point of contact to the grids provides certain advantages over a flat, or pointed contact shape. The spheric shape of the contact is almost a point contact, with certain advantages of a point contact. In contrast to a flat contact shape, a small or point contact reduces thermal heat transfer from the grid to the contactor. However, a small or point contact has a disadvantage of providing higher electrical current density through the small or point contact. Accordingly, the material properties of the contactor and the grid should be considered and materials that exhibit poor "spot weld" or "electrical contact weld" properties are desireable. In the instant design, the grids and contactors are both molybdneum, which exhibit poor spot weld properties (i.e., they are very hard to spot weld). This helps to ensure that even with high current density through a small or point contact, the contact surfaces will not weld together. The spheric shape of the contactor also helps to enhance slip between the contactor and the grid, by reducing the area for friction between the two surfaces.

Although illustrative embodiments have been described herein in detail, it should be noted and will be appreciated by those skilled in the art that numerous variations may be made within the scope of this invention without departing from the principle of this invention and without sacrificing its chief advantages.

Unless otherwise specifically stated, the terms and expressions have been used herein as terms of description and not terms of limitation. There is no intention to use the terms or expressions to exclude any equivalents of features shown and described or portions thereof and this invention should be defined in accordance with the claims that follow.

We claim:

1. An electrode mounting ring comprising:
   multiple contact regions adapted to contact multiple electrodes such that said electrodes are stacked with predetermined spacings; and
   multiple hidden regions, the hidden regions being formed by an overhang of the multiple electrodes and recesses in the electrode mounting ring.

2. An electrode mounting ring according to claim 1, the hidden regions having an aspect ratio of at least 5.

3. An electrode mounting ring according to claim 1, wherein the contact regions and the hidden regions are substantially circular.

4. An electrode mounting ring according to claim 1, wherein the electrode mounting ring is dielectric.

5. An electrode mounting ring according to claim 1, wherein the electrode mounting ring is substantially alumina.

6. An electrode mounting ring according to claim 1, wherein each of the multiple contact regions and the multiple hidden regions are different diameters.

7. An electric contact for a charged particle electrode comprising:
   a conducting contact;
   a spring adapted to bias the contact to the electrode; and
   a holder adapted to hold the contact and the spring,
   wherein the spring is insulated from the holder.

8. An electric contact according to claim 7, the conducting contact comprising molybdenum.

* * * * *